United States Patent
Okamoto et al.

(10) Patent No.: US 6,247,526 B1
(45) Date of Patent: Jun. 19, 2001

(54) COOLING DEVICE WITH ARRANGEMENT OF CENTRIFUGAL FAN

(75) Inventors: Yoshiyuki Okamoto; Hajime Sugito, both of Nagoya; Kiyoshi Kawaguchi, Toyota; Toshihiro Mafune, Kariya; Koji Kishita, Motosu-gun, all of (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/417,984

(22) Filed: Oct. 13, 1999

(30) Foreign Application Priority Data

Nov. 19, 1998 (JP) .................................................. 10-329497

(51) Int. Cl.[7] ...................................................... H05K 7/20
(52) U.S. Cl. .................... 165/122; 165/104.34; 165/164; 361/696
(58) Field of Search .............................. 165/104.34, 122, 165/164; 361/696

(56) References Cited

U.S. PATENT DOCUMENTS

| 3,559,728 | * | 2/1971 | Lyman et al. ................... 165/104.34 |
| 4,386,651 | * | 6/1983 | Reinhard ........................ 165/104.33 |

FOREIGN PATENT DOCUMENTS

| 2231469 | * | 3/1974 | (DE) ................................. 165/104.34 |
| 2743708 | * | 4/1979 | (DE) ................................. 165/104.34 |
| 2744664 | * | 4/1979 | (DE) ................................. 165/104.34 |
| 2576679 | * | 8/1986 | (FR) ................................. 165/104.34 |

* cited by examiner

*Primary Examiner*—Allen Flanigan
(74) *Attorney, Agent, or Firm*—Harness, Dickey & Pierce, PLC

(57) ABSTRACT

A cooling device for cooling a heat radiation member disposed in a sealed space includes a heat exchanger in which high-temperature air within the sealed space exchanges heat with low-temperature air outside the sealed space, and first and second centrifugal fans for blowing high-temperature air and low-temperature air into the heat exchanger, respectively. Each of the first and second centrifugal fans is disposed in an upstream side space of the heat exchanger at a side position shifted from center so that a large air-blowing space can be provided within the upstream side space. Thus, high-temperature air and low-temperature air blown by the first and second centrifugal fans can be uniformly introduced into the heat exchanger, respectively.

15 Claims, 3 Drawing Sheets

COOLING DEVICE WITH ARRANGEMENT OF CENTRIFUGAL FAN

CROSS-REFERENCE TO RELATED APPLICATION

This application is related to and claims priority from Japanese Patent Application No. Hei. 10-329497 filed on Nov. 19, 1998, the contents of which are hereby incorporated by reference.

BACKGROUND OF THE INVENTION

1. Field of the Invention

The present invention relates to a cooling device for cooling high-temperature air by performing heat exchange between high-temperature air and low-temperature air flowing adjacent to each other. More particularly, the present invention relates to a cooling device with an arrangement of a centrifugal fan.

2. Description of Related Art

In a conventional cooling device, high-temperature air within a sealed space accommodating a heat radiation member such as an electrical machine is heat-exchanged with low-temperature air so that temperature of the sealed space is restricted from being increased.

SUMMARY OF THE INVENTION

It is an object of the present invention to provide a device in which a first passage through which a first fluid flows and a second passage through which a second fluid flows are arranged adjacent to each other, while the first fluid and the second fluid are uniformly introduced into the first and second passages, respectively.

It is an another object of the present invention to provide a cooling device which effectively cools a first fluid within a sealed space for accommodating a heat radiation member by performing heat-exchange between the first fluid and a second fluid outside the sealed space.

According to a first aspect of the present invention, a device for performing heat exchange between a first fluid and a second fluid includes a heat exchanger having a first passage through which the first fluid flows and a second passage through which the second fluid flows, a first case for forming a first space communicating with the first passage on an upstream side of the first passage, and a first centrifugal fan for blowing the first fluid into the first passage of the heat exchanger. The first passage and the second passage are arranged adjacent to each other in the heat exchanger, and the first centrifugal fan is disposed and rotated in the first space at one side shifted from a center so that the first fluid is blown toward the other side of the first space opposite to the one side. Thus, a large air-blowing space is formed in the first space on a side of the first centrifugal fan. As a result, the first fluid uniformly flows into the first passage through the large air-blowing space.

Preferably, the device further includes a second case for forming a second space communicating with the second passage on an upstream side of the second passage, and a second centrifugal fan for blowing the second fluid into the second passage of the heat exchanger. Further, the second centrifugal fan is disposed in the second space at one side shifted from a center, and is rotated so that the second fluid is blown toward the other side of the second space opposite to the one side. Thus, a large air-blowing space is formed in the second space, and the second fluid uniformly flows into the second passage through the large air-blowing space.

According to a second aspect of the present invention, in a device for performing a heat exchange between a first fluid and a second fluid, plural first centrifugal fans for blowing the first fluid into a first passage of a heat exchanger are arranged in a first space upstream from the first passage, and are operated in the same rotation direction with different output power, so that each output power from the first centrifugal fans is decreased in order toward an air-blowing direction of the first centrifugal fans. Thus, the first fluid can be uniformly introduced into the first passage through the first space.

Preferably, plural second centrifugal fans for blowing the second fluid into a second passage of the heat exchanger are arranged in a second space upstream from the second passage, and are operated in the same rotation direction with different output power, so that each output power from the second centrifugal fans is decreased in order toward an air-blowing direction of the second centrifugal fans. Thus, both the first fluid and second fluid can be uniformly introduced into the first and second passage of the heat exchange, respectively, and heat-exchanging performance of the heat exchanger can be improved.

More preferably, the first fluid has temperature higher than that of the second fluid. Therefore, the device can be used as a cooling device for cooling the first fluid. Because the first fluid and the second fluid respectively uniformly passes through the first and second passages adjacent to each other, the first fluid flowing though the first passage can be effectively cooled in the heat exchanger by the second fluid flowing through the second passage.

BRIEF DESCRIPTION OF THE DRAWINGS

Additional objects and advantages of the present invention will be more readily apparent from the following detailed description of preferred embodiments when taken together with the accompanying drawings, in which.

DETAILED DESCRIPTION OF THE PRESENTLY PREFERRED EMBODIMENTS

Preferred embodiment of the present invention will be described hereinafter with reference to the accompanying drawings.

Figure 1:
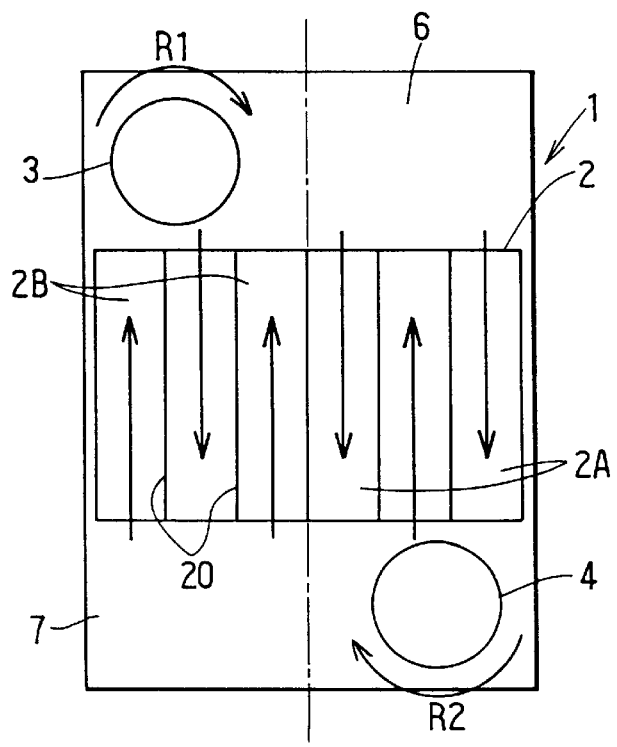
FIG. 1 is a schematic view showing an arrangement of centrifugal fans in a cooling device according to a first preferred embodiment of the present invention.
Figure 2:
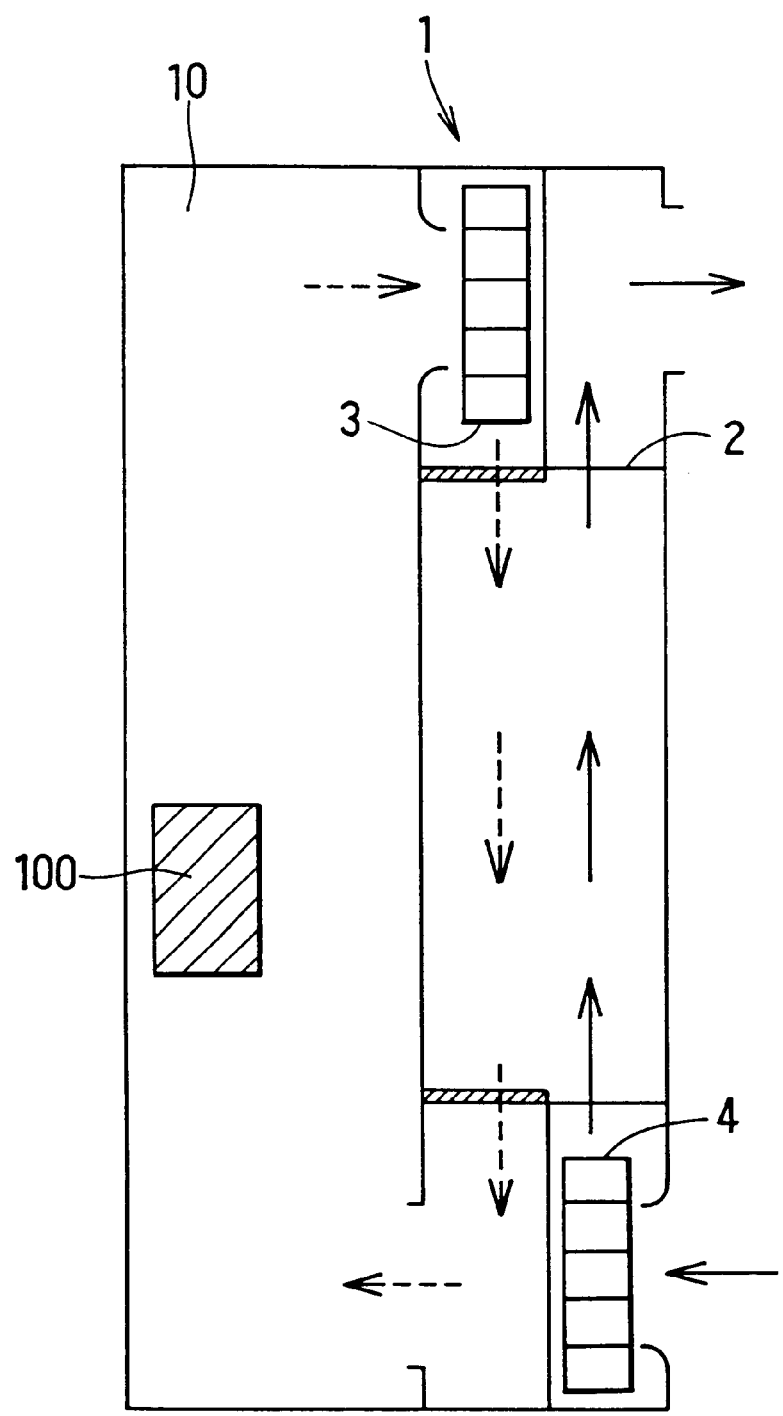
FIG. 2 is a schematic side view of the cooling device according to the first embodiment.

A first preferred embodiment of the present invention will be now described with reference to FIGS. 1, 2. As shown in FIGS. 1, 2, a cooling device 1 includes a heat exchanger 2 for performing heat exchange between high-temperature air (e.g., inside air within a sealed space 10) and low-temperature air (e.g., outside air), a first centrifugal fan 3 for blowing high-temperature air toward the heat exchanger 2, and a second centrifugal fan 4 for blowing low-temperature air toward the heat exchanger 2. A heat radiation member 100 such as an electrical machine is disposed within the sealed space 10.

The heat exchanger 2 is made of metal having a sufficient heat-transmitting performance, such as aluminum and copper. The heat exchanger 2 has therein plural first air passages 2A through which high-temperature air flows, and plural second air passages 2B through which low-temperature air flows. The plural first air passages 2A and the plural second air passages 2B are alternately arranged in parallel with each other, and are defined by a partition wall 20 disposed between adjacent first and second air passages 2A, 2B. Therefore, high-temperature air and low-temperature air flow adjacent to each other through the first air passages 2A and the second air passages 2B, respectively.

The first centrifugal fan 3 is disposed in an upstream side space through which high-temperature air of the sealed space flows into the first air passages 2A, at a position shifted from a center of the upstream side space. Specifically, the first centrifugal fan 3 is disposed at a side position so that a large air space 6 can be obtained on an upstream side of the first air passages 2A in a forward side of an air-blowing direction (i.e., rotation direction R1) of the first centrifugal fan 3. That is, when the first centrifugal fan 3 disposed on an upper side of the heat exchanger 2 is rotated rightwardly, the first centrifugal fan 3 is disposed to be shifted leftwardly so that the large air space 6 is provided on a right side of the first centrifugal fan 3, as shown in FIG. 1.

Similarly to the first centrifugal fan 3, the second centrifugal fan 4 is disposed at a side position shifted from a center of an upstream side space of the second passage 2B so that a large air space 7 can be defined on an upstream side of the second air passages 2B in a forward side of an air-blowing direction (i.e., rotation direction R2) of the second centrifugal fan 4. As shown in FIG. 1, in the first embodiment, the second centrifugal fan 4 disposed on a lower side of the heat exchanger 2 is rotated rightwardly, and is disposed to be shifted rightwardly so that the large air space 7 is provided on a left side of the second centrifugal fan 4.

Next, operation of the cooling device 1 according to the first embodiment will be now described. When the first centrifugal fan 3 and the second centrifugal fan 4 are operated, high-temperature air within the sealed space 10 flows through the first air passages 2A of the heat exchanger 2, and low-temperature air outside the seal space 10 flows through the second air passages 2B of the heat exchanger 2. Therefore, high-temperature air flowing through the first air passages 2A is heat-exchanged with low-temperature air flowing through the second air passages 2B in the heat exchanger 2 to be cooled, and is returned into the sealed space 10.

In FIG. 1, when the first centrifugal fan 3 is disposed in the upstream side space of the first air passages 2A at the center position, high-temperature air hardly flows into an opposite side (i.e., left side in FIG. 1) of the air-blowing direction of the first centrifugal fan 3. As a result, high-temperature air ununiformly flows through the first air passages 2A.

However, according to the first embodiment of the present invention, the first centrifugal fan 3 is disposed on the side position shifted from the center position so that the large space 6 is formed on the forward side of the air-blowing direction of the first centrifugal fan 3. Therefore, high-temperature air blown by the first centrifugal fan 3 can uniformly flow through the first air passages 2A of the heat exchanger 2. Further, the second centrifugal fan 4 is disposed on the side position shifted from the center position so that the large space 7 is formed on the forward side of the air-blowing direction of the second centrifugal fan 4. Therefore, low-temperature air blown by the second centrifugal fan 4 can be uniformly introduced into the second air passages 2B of the heat exchanger 2, and is effectively heat-exchanged with high-temperature air flowing through the first air passages 2A. Thus, cooling performance for cooling the heat radiation member 100 within the sealed space 10 can be improved in the cooling device 1.

Figure 3:
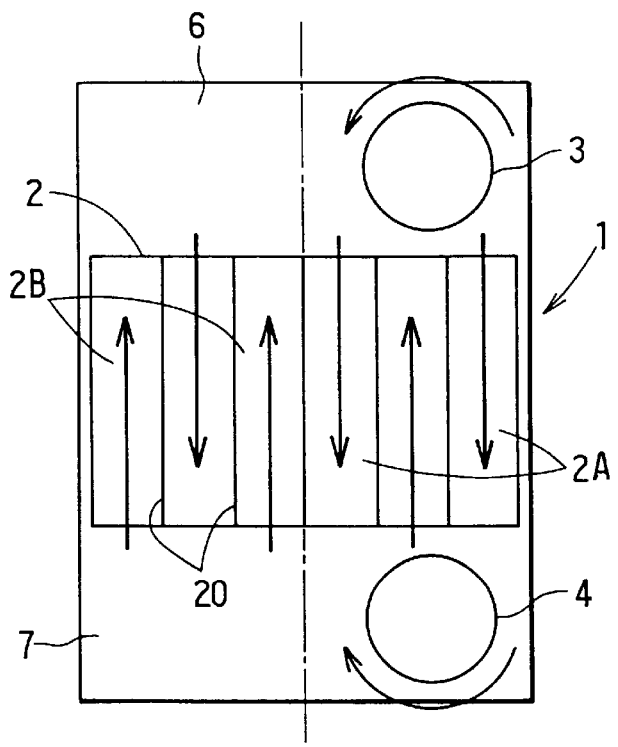
FIG. 3 is a schematic view showing an arrangement of centrifugal fans in a cooling device according to a second preferred embodiment of the present invention.

A second preferred embodiment of the present invention will be described with reference to FIG. 3. In the above-described first embodiment, both the first and second centrifugal fans 3, 4 are rotated in the right direction (i.e., in clockwise). However, in the second embodiment, one of the first and second fans 3, 4 are rotated in the right direction, and the other one thereof is rotated in the left direction (i.e., in anticlockwise). For example, as shown in FIG. 3, the first centrifugal fan 3 disposed at the upstream side space of the heat exchanger 2 is rotated in the left direction, and is position at the right side to form the large space 6 on the left side of the first centrifugal fan 3. Therefore, high-temperature air blown by the first centrifugal fan 3 can uniformly flow through the first air passages 2A.

In the second embodiment, because the first and second centrifugal fans 3, 4 are disposed on the same side, a flow distribution of high-temperature air corresponds to that of low-temperature air, heat-exchanging performance can be further improved in the heat exchanger 2. When the first and second centrifugal fans 3, 4 are disposed on the left side and are rotated respectively reversely with the rotation direction in FIG. 3, the same effect as the second embodiment can be proposed.

Figure 4:
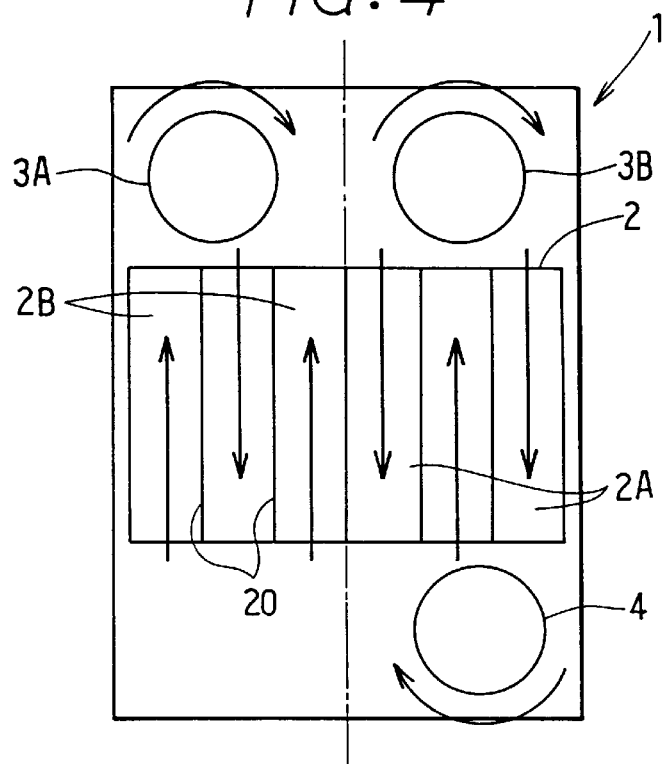
FIG. 4 is a schematic view showing an arrangement of centrifugal fans in a cooling device according to a third preferred embodiment of the present invention.

A third preferred embodiment of the present invention will be now described with reference to FIG. 4. In the above-described first and second embodiments of the present invention, each of the first and second centrifugal fans 3, 4 is a single fan disposed independently in each space. In the third embodiment, plural centrifugal fans are disposed in a space. For example, as shown in FIG. 4, both first centrifugal fans 3A, 3B are disposed in the upstream side space of the first air passages 2A, and are rotated in the same direction with different power. Specifically, both the first centrifugal fans 3A, 3B are rotated in the right direction, and the centrifugal fan 3B disposed on the right side of the centrifugal fan 3A is rotated with power smaller than that of the centrifugal fan 3A.

According to the third embodiment, air is blown toward the forward side of the air-blowing direction with an air-blowing amount of the centrifugal fan 3B in addition to an air blowing amount of the centrifugal fan 3A. Therefore, the flow distribution of high-temperature air passing through the first air passages 2A can be made uniform.

Figure 5:
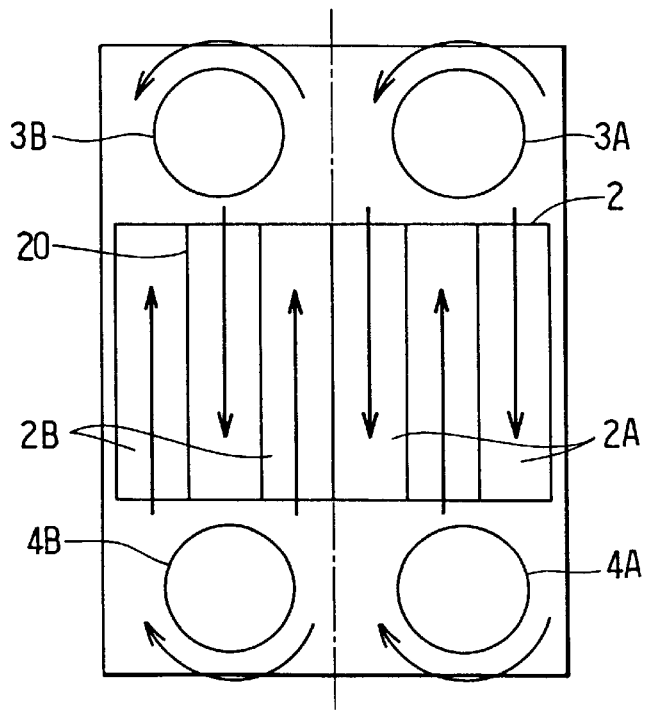
FIG. 5 is a schematic view showing an arrangement of centrifugal fans in a cooling device according to a fourth preferred embodiment of the present invention.

A fourth preferred embodiment of the present invention will be now described with reference to FIG. 5. In the fourth embodiment, plural first centrifugal fans 3A, 3B rotated in the same direction are disposed in the upstream side space of the first air passages 2A, and plural second centrifugal fans 4A, 4B rotated in the same direction are disposed in the upstream side space of the second air passages 2B. For example, as shown in FIG. 5, both the second centrifugal fans 4A, 4B are disposed in the same space, while both the first centrifugal fan 3A, 3B are disposed in the same space similarly to the third embodiment. In the fourth embodiment, both the second centrifugal fans 4A, 4B are rotated in the right direction. Further, the centrifugal fan 4B is operated with power smaller than that of the centrifugal fan 4A. Therefore, air is blown toward the forward side of the air-blowing direction with an air-blowing amount of the centrifugal fan 4B in addition with an air blowing amount of the centrifugal fan 4A. Thus, the flow distribution of high-temperature air passing through the first air passages 2A and the flow distribution of low-temperature air passing through the second air passages 2B can be made uniform.

Although the present invention has been fully described in connection with the preferred embodiments thereof with reference to the accompanying drawings, it is to be noted that various changes and modifications will become apparent to those skilled in the art.

For example, in the above-described embodiments, the present invention is typically applied to the cooling device where high-temperature air circulates in the sealed space 10 and the first passage 2A, and low-temperature air such as outside air passes through the second air passages 2B. However, the present invention may be applied to a cooling device using the other fluid. That is, fluid passing through the first and second air passages 2A, 2B of the heat exchanger 2 can be arbitrarily changed.

Further, in the above-described embodiment, the present invention is applied to the cooling device for cooling the heat radiation member 100. However, the present invention may be applied to a device having the heat exchanger 2 and a centrifugal fan for blowing fluid into the heat exchanger 2.

Such changes and modifications are to be understood as being within the scope of the present invention as defined by the appended claims.

What is claimed is:

1. A device for performing heat exchange between a first fluid and a second fluid, said device comprising:
    a heat exchanger having a first passage including a plurality of first passage portions through which the first fluid flows and a second passage including a plurality of second passage portions through which the second fluid flows, said first passage portions and said second passage portions being arranged alternately to each other in an arrangement direction;
    a first case for forming a first space communicating with said first passage on an upstream side of said first passage; and
    a first centrifugal fan for blowing the first fluid into said first passage of said heat exchanger, said first centrifugal fan having an axial direction approximately perpendicular to the arrangement direction, the axial direction of said first centrifugal fan being provided in said first space at one side shifted from a center in the arrangement direction, wherein sad first centrifugal fan is disposed in said first space so that the first fluid sucked in the axial direction is blown radial outside toward the other side of said first space opposite to the one side.

2. The device according to claim 1, further comprising:
    a second case for forming a second space communicating with said second passage on an upstream side of said second passage; and
    a second centrifugal fan for blowing the second fluid into said second passage of said heat exchanger, said second centrifugal fan having an axial direction approximately perpendicular to the arrangement direction, the axial direction of said second centrifugal fan being provided in said second space at one side shifted from a center in the arrangement direction, wherein said second centrifugal fan is disposed in said second space so that the second fluid sucked in the axial direction is blown radial outside toward the other side of said second space opposite to the one side.

3. The device according to claim 2, wherein:
    said first and second centrifugal fans are disposed so that a flow direction of the first fluid passing through said first passage is opposite to that of the second fluid passing through said second passage.

4. The device according to claim 1, further comprising:
    a second case for forming a second space communicating with said second passage on an upstream side of said second passage; and
    a plurality of second centrifugal fans operated in the same rotation direction with different output power, for blowing the second fluid into said second passage of said heat exchanger, said second centrifugal fans being arranged in said second space so that each output power from said second centrifugal fans is decreased in order toward an air-blowing direction of said second centrifugal fans.

5. A device for performing heat exchange between a first fluid and a second fluid, said device comprising:
    a heat exchanger having a first passage including a plurality of first passage portions through which the first fluid flows and a second passage including a plurality of second passage portions through which the second fluid flows, said first passage portions and said second passage portions being arranged alternately to each other in an arrangement direction;
    a first case forming a first space communicating with said first passage on an upstream side of said first passage; and
    a plurality of first centrifugal fans operated in the same rotation direction with different output power for blowing the first fluid into said first passage of said heat exchanger, said first centrifugal fans being arranged in said first space so that each output power from said first centrifugal fans is decreased in order toward an air-blowing direction of said first centrifugal fans.

6. The device according to claim 5, further comprising:
    a second case for forming a second space communicating with said second passage on an upstream side of said second passage; and
    a plurality of second centrifugal fans operated in the same rotation direction with different output power, for blowing the second fluid into said second passage of said heat exchanger, said second centrifugal fans being arranged in said second space so that each output power from said second centrifugal fans is decreased in order toward an air-blowing direction of said second centrifugal fans.

7. A cooling device for cooling a heat radiation member disposed in sealed space in which a first fluid circulates, said cooling device comprising:
    a heat exchanger having a first passage including a plurality of first passage portions through which the first fluid flows and a second passage including a plurality of second passage portions through which a second fluid having temperature lower than that of the first fluid flows, said first passage portions and said second passage portions being arranged alternately to each other in an arrangement direction;
    a first case for forming a first space communicating with said first passage on an upstream side of said first passage; and a first centrifugal fan for blowing the first fluid into said first passage of said heat exchanger, said first centrifugal fan having an axial direction approximately perpendicular to the arrangement direction, the axial direction of said first centrifugal fan being provided in said first space at one side shifted from a center in the arrangement direction, wherein said first centrifugal fan is disposed in said first space so that the first fluid sucked in the axial direction is blown radial outside toward the other side of said first space opposite to the one side.

8. The cooling device according to claim 7, further comprising:

a second case for forming a second space communicating with said second passage on an upstream side of said second passage; and a second centrifugal fan for blowing the second fluid into the second passage of said heat exchanger, said second centrifugal fan having an axial direction approximately perpendicular to the arrangement direction, the axial direction of said second centrifugal fan being provided in said second space at one side shifted from a center in the arrangement direction, wherein said second centrifugal fan is disposed in said second space so that the second fluid sucked in the axial direction is blown radial outside toward the other side of said second space opposite to the one side.

9. The cooling device according to claim 7, further comprising:

a second case for forming a second space communicating with said second passage on an upstream side of said second passage; and a plurality of second centrifugal fans operated in the same rotation direction with different output power, for blowing the second fluid into said second passage of said heat exchanger, said second centrifugal fans being arranged in said second space so that each output power from said second centrifugal fans is decreased in order toward an air-blowing direction of said second centrifugal fans.

10. A device for performing heat exchange between a first fluid and a second fluid, said device comprising:

a first case forming a first space, said first case having a height direction, a width direction and a depth direction;

a heat exchanger disposed within said case, said heat exchanger having a first passage through which said first fluid flows and a first passage through which said first fluid flows and a second passage through which said second fluid flows, said first and second passages being arranged adjacent to each other in said width direction of said case and extending generally parallel to said height direction of said first case, said first space communicating with said first passage;

a first centrifugal fan for blowing said first fluid into said first passage, said first centrifugal fan being disposed in said first space at one side shifted from a center in said width direction of said case.

11. The device according to claim 10, further comprising:

a second case forming a second space communicating with said second passage;

a second centrifugal fan for blowing said second fluid into said second passage, said second centrifugal fan being disposed in said second space at one side shifted from said center in said width direction of said case.

12. The device according to claim 11, wherein:

said first and second centrifugal fans are disposed so that a flow direction of the first fluid passing through said first passage is opposite to that of the second fluid passing through said second passage.

13. The device according to claim 11, wherein said second centrifugal fan draws said second fluid in a direction generally parallel to said depth direction of said case.

14. The device according to claim 13, wherein said first centrifugal fan draws said first fluid in a direction generally parallel to said depth direction of said case.

15. Device according to claim 10, wherein said first centrifugal fan draws said first fluid in a direction generally parallel to said depth direction of said case.

* * * * *